US012283497B2

(12) United States Patent
Choi et al.

(10) Patent No.: US 12,283,497 B2
(45) Date of Patent: Apr. 22, 2025

(54) SEMICONDUCTOR DEPOSITION MONITORING DEVICE

(71) Applicant: SAMSUNG ELECTRONICS CO., LTD., Suwon-si (KR)

(72) Inventors: Young Uk Choi, Seoul (KR); Yeon Tae Kim, Suwon-si (KR); Tae Soon Park, Hwaseong-si (KR); Kee Soo Park, Hwaseong-si (KR); Sung-Gyu Park, Yongin-si (KR); Kwang-Hyun Yang, Suwon-si (KR); Seung Hun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 792 days.

(21) Appl. No.: 17/155,672

(22) Filed: Jan. 22, 2021

(65) Prior Publication Data

US 2021/0388501 A1 Dec. 16, 2021

(30) Foreign Application Priority Data

Jun. 10, 2020 (KR) ........................ 10-2020-0070160

(51) Int. Cl.
*C23C 16/52* (2006.01)
*C23C 16/44* (2006.01)
(Continued)

(52) U.S. Cl.
CPC .... *H01L 21/67115* (2013.01); *C23C 16/4405* (2013.01); *C23C 16/45536* (2013.01);
(Continued)

(58) Field of Classification Search
CPC .................................................. C23C 16/4412
See application file for complete search history.

(56) References Cited

U.S. PATENT DOCUMENTS 5,160,545 A * 11/1992 Maloney ............... C30B 25/105 118/724
5,346,555 A * 9/1994 Nunotani .......... H01L 21/67115 118/724
(Continued)

FOREIGN PATENT DOCUMENTS

JP 2012-253142 12/2012
JP 2013-070058 A2 4/2013
(Continued)

OTHER PUBLICATIONS

Office Action dated Mar. 27, 2024 in corresponding Korean Patent Application No. 10-2020-0070160 (in Korean), 10 pages.

*Primary Examiner* — Joseph A Miller, Jr.
(74) *Attorney, Agent, or Firm* — F. CHAU & ASSOCIATES, LLC

(57) ABSTRACT

The present disclosure provides a semiconductor deposition monitoring device comprising a supporting table, a chamber, a lamp, an optical sensor, a conduit, a plurality of sensors in the conduit, and a heat exchanger. The supporting table supports a deposition target wafer on which a deposition material is deposited. The chamber comprises an upper dome and a lower dome. The lamp emits light to the chamber. The optical sensor receives the irradiated light and measures the deposition material formed in the chamber. The conduit has an inlet conduit through which air is injected into the chamber and an outlet conduit through which the air is discharged from the chamber. The plurality of sensors sense information of the air. The sensed information may be used to control the heat exchanger.

7 Claims, 10 Drawing Sheets

(51) Int. Cl.
*C23C 16/455* (2006.01)
*C30B 25/08* (2006.01)
*C30B 25/10* (2006.01)
*C30B 25/16* (2006.01)
*H01L 21/67* (2006.01)

(52) U.S. Cl.
CPC .............. *C23C 16/52* (2013.01); *C30B 25/08* (2013.01); *C30B 25/10* (2013.01); *C30B 25/165* (2013.01); *H01L 21/67248* (2013.01); *H01L 21/67253* (2013.01)

(56) References Cited

U.S. PATENT DOCUMENTS 5,536,317 A * 7/1996 Crain .................. C08G 61/025 118/712
5,985,032 A 11/1999 Eriguchi
6,169,271 B1 1/2001 Savas et al.
7,718,225 B2 5/2010 Kuppurao et al.
10,026,597 B2 7/2018 Rodrigo et al.
10,196,738 B2 2/2019 Lee et al.
10,340,128 B2 7/2019 Yazawa
2001/0031229 A1* 10/2001 Spjut .................... H05B 3/0047 422/186.3
2001/0043984 A1* 11/2001 Otsubo ............... C23C 16/4401 427/248.1
2002/0033232 A1* 3/2002 Raaijmakers ......... C23C 16/481 118/723 R
2005/0233479 A1* 10/2005 Chang ............... H01L 21/67109 156/345.1
2007/0042117 A1* 2/2007 Kuppurao ......... H01L 21/67115 118/724
2007/0215043 A1 9/2007 Yamazawa et al.
2008/0124453 A1* 5/2008 Bour .................. C23C 16/4401 118/712
2008/0182345 A1* 7/2008 Sugishita ................ H01L 22/20 118/712
2009/0260783 A1 10/2009 Suzuki et al.
2012/0064469 A1 3/2012 Yoshii et al.
2014/0044863 A1* 2/2014 Kim ........................ C23C 16/52 118/713
2014/0227458 A1 8/2014 Karakawa et al.
2019/0276938 A1* 9/2019 Sugishita ................ H01L 21/02

FOREIGN PATENT DOCUMENTS

KR 10-2013-0051454 A 5/2013
KR 10-1506894 3/2015
KR 10-2018-0005465 A 1/2018

* cited by examiner

SEMICONDUCTOR DEPOSITION MONITORING DEVICE

CROSS-REFERENCE TO RELATED APPLICATION

This application claims priority from Korean Patent Application No. 10-2020-0070160 filed on Jun. 10, 2020 in the Korean Intellectual Property Office, and all the benefits accruing therefrom under 35 U.S.C. 119, the contents of which are incorporated by references herein in their entirety.

BACKGROUND

1. Technical Field

The present disclosure relates to a semiconductor deposition monitoring device.

2. Description of the Related Art

A semiconductor is a material with conductivity between a conductor and an insulator. Semiconductor materials are used in semiconductor devices, which may be used to create circuits in electronic devices.

A semiconductor device may be manufactured using series of process including a thin film process, a photo process, an etching process, and a diffusion process. The thin film process, also called a deposition process, may be carried out using a vapor deposition method. A cleaning process is then performed to remove any by-product (deposition material).

Cleaning may be performed using a cleaning gas (i.e., dry cleaning). Additionally or alternatively, a wet cleaning method is performed (e.g., when a dry cleaning method is not sufficient). A cleaning processes can be costly and time consuming. For example, a wet cleaning method may involve the disassembly of the chamber, such as where a worker manually cleans with a cleaning solution.

Furthermore, equipment used to deposit single crystal thin films may be sensitive to temperature. Excessive temperatures may lead to deterioration of a quartz process kit used in the deposition process. Therefore, to improve the deposition process and reduce the frequency of costly cleaning methods, there is a need in the art to control the temperature of a deposition equipment, accurately analyze the formation of by-products, and minimize their formation.

SUMMARY

Aspects of the present disclosure provide a semiconductor deposition monitoring device that is capable of improving a control accuracy and reproducibility of a temperature for a semiconductor deposition device to perform a deposition operation on a wafer.

Aspects of the present disclosure also provide a semiconductor deposition monitoring device that is capable of improving accuracy of analysis on by-products formed inside a chamber when a semiconductor deposition device performs a deposition operation on a wafer.

However, aspects of the present inventive concept are not restricted to the one set forth herein. The above and other aspects of the present inventive concept will become more apparent to one of ordinary skill in the art to which the present inventive concept pertains by referencing the detailed description of the present inventive concept given below.

According to an aspect of the present inventive concept, there is provided a semiconductor deposition monitoring device, comprising, a supporting table configured to support a deposition target wafer on which a deposition material is deposited; a chamber including an upper dome covering upper portions of the supporting table and the wafer, and a lower dome covering lower portions of the supporting table and the wafer; a conduit including an inlet conduit through which air is injected into the chamber and an outlet conduit through which the air is discharged from the chamber, the conduit further including a plurality of sensors for sensing information of the air; and a heat exchanger module connected to the conduit and configured to adjust heat of the air based on sensing values received from the plurality of sensors.

According to an aspect of the present inventive concept, there is provided a semiconductor deposition monitoring device, comprising, a supporting table configured to support a deposition target wafer on which a deposition material is deposited, a chamber including an upper dome covering upper portions of the supporting table and the wafer, and a lower dome covering lower portions of the supporting table and the wafer, a laser sensor configured to irradiate a laser beam from an outside of the chamber to detect an intensity of the laser beam penetrated through the chamber, a lamp configured to irradiate light to the chamber, an optical sensor configured to receive the irradiated light and measure an amount of the deposition material formed in the chamber, a conduit including an inlet conduit through which air is injected into the chamber and an outlet conduit through which the air is discharged from the chamber, and including a plurality of sensors for sensing information of the air; and a heat exchanger module connected to the conduit and configured to adjust heat of the air based on sensing values received from the plurality of sensors.

According to an aspect of the present inventive concept, there is provided a semiconductor deposition monitoring device, comprising, a supporting table configured to support a deposition target wafer on which a deposition material is deposited, a chamber including an upper dome covering upper portions of the supporting table and the wafer, and a lower dome covering lower portions of the supporting table and the wafer, a lamp configured to irradiate light to the chamber, an optical sensor configured to receive the irradiated light and measure an amount of the deposition material formed in the chamber, a conduit including an inlet conduit through which air is injected into the chamber and an outlet conduit through which the air is discharged from the chamber, and including a plurality of sensors for sensing information of the air, a heat exchanger module connected to the conduit and configured to produce the air, and a controller configured to adjust heat of the air based on sensing values received from the plurality of sensors and transmit an adjusted heat value to the heat exchanger module.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

The present disclosure relates generally to a semiconductor deposition monitoring device. More particularly, embodiments of the present disclosure relate to a semiconductor deposition monitoring device with a heat exchanger module. Some embodiments may adjust the condition of the air flowing through a semiconductor deposition device based on information collected about the air.

An example semiconductor deposition monitoring device comprises a supporting table, a chamber, a lamp, an optical sensor, a conduit, and a plurality of sensors. The supporting table is configured to support a deposition target wafer on which a deposition material is deposited. The chamber comprises an upper dome and a lower dome. The upper and lower domes cover upper and lower portions of the supporting table and the wafer. The lamp is configured to irradiate light to the chamber.

In some embodiments, the optical sensor is configured to receive the irradiated light and measure an amount of the deposition material formed in the chamber. The conduit has an inlet conduit through which air is injected into the chamber and an outlet conduit through which the air is discharged from the chamber. The plurality of sensors sense information of the air and a heat exchanger module.

Figure 1:
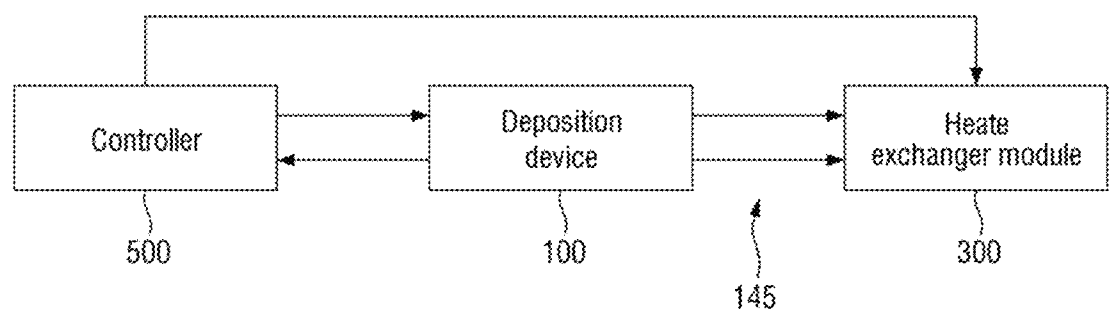
FIG. 1 is a block diagram exemplarily illustrating a semiconductor deposition monitoring device according to some embodiments.

FIG. 1 is a block diagram exemplarily illustrating a semiconductor deposition monitoring device according to some embodiments.

In some examples, the semiconductor deposition monitoring device is used to monitor semiconductor deposition equipment. For example, the semiconductor deposition may deposits single crystal thin films using Selective Epitaxial Growth (SEG), which is very sensitive to temperature. Therefore, precise temperature control and temperature reproducibility are desirable. In some cases, as silicon wafer may be placed in a vacuum chamber of the semiconductor deposition equipment. The vacuum chamber may include a quartz dome (i.e., a process kit). The wafer may be mounted on a platform such as a coated Graphite susceptor.

A semiconductor deposition monitoring device may detect deterioration and enable uniform temperature control of the quartz process kit. In some cases, a Pyrometer Offset (Lamp Power Offset) may be adjusted by inspecting the deposition amount wafers transferred after the SEG process. The heat may be supplied in a way that allows simple air into an upper/lower air cooling module (which cools the temperature of the Quartz process kit). The amount of heat dissipated may be controlled by measuring the flow rate and controlling the fan speed. Additionally, a simple flow measurement type air cooling module may also be used to control atmospheric pressure.

However, offset control and real-time temperature control can be difficult. Imprecise temperature measurements may result loss of efficiency. Thus, embodiments of the present disclosure provide, in real time, a Quartz process kit deterioration detection sensor with increased precision that detects deterioration of the kit and enables power offset control.

Referring to FIG. 1, a semiconductor deposition monitoring device 10, according to some embodiments, includes a controller 500, a semiconductor deposition device 100, and a heat exchanger module 300.

The controller 500 may be connected to the semiconductor deposition device 100 and the heat exchanger module 300 in a wireless or wired manner to transmit and receive signals with deposition-related information. The controller 500 may, for example, check the state of a by-product BP formed in the chamber 110 of the semiconductor deposition device 100 of FIG. 2 and determine whether the state of the by-product BP is within a tolerance range. The controller 500 may check the state of the by-product BP and adjust a process condition. Here, the by-product BP may be a deposition material or a modified form of the deposition material.

Additionally, or alternatively, the controller 500 may inject air into the chamber 110 inside the semiconductor deposition device 100 and adjust the air condition based on sensing information collected by a plurality of sensors in a conduit through which air flows from the chamber 110.

The controller 500, according to some embodiments, may be configured as, for example, a general personal computer (PC), a workstation, or a supercomputer, but is not limited thereto.

The semiconductor deposition device 100 may perform deposition on a wafer based on the process condition or air condition adjusted by the controller 500 and/or the heat exchanger module 300.

The heat exchanger module 300 may adjust the condition of the air flowing in the semiconductor deposition device 100 through a conduit 145 based on the information on the air in the semiconductor deposition device 100. Further, the heat exchanger module 300 may receive the information on the condition of the air adjusted by the controller 500 and transport the condition-adjusted air to the semiconductor deposition device 100 through the conduit 145.

Descriptions are made hereinafter of the semiconductor deposition device 100, the heat exchanger module 300, and the conduit 145 in detail with reference to FIG. 2.

Figure 2:
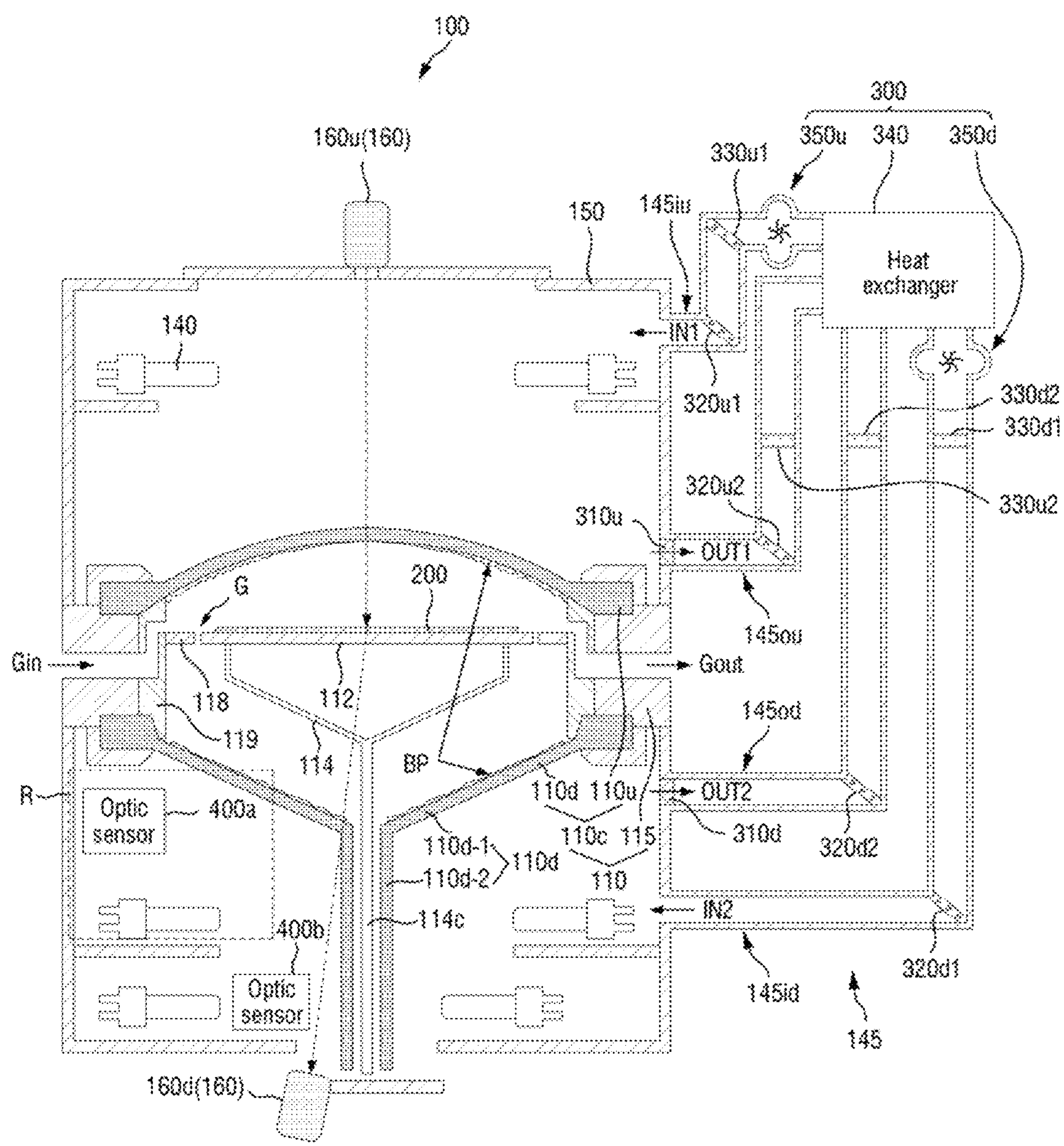
FIG. 2 is a diagram illustrating a semiconductor deposition device and a heat exchanger module of a semiconductor deposition monitoring device according to some embodiments.

FIG. 2 is a diagram illustrating a semiconductor deposition device and a heat exchanger module of a semiconductor deposition monitoring device according to some embodiments.

In order to maintain a constant temperature within and between facilities, a measurement sensor and a control module for the heat exchanger may be used. For example, a sensor module may measure the flow rate, temperature, and pressure of the air flow, and the sensed signals may be processed to provide heat control signals. In some examples, a conversion processing unit and a control unit can control the fan speed of an heat exchanger.

In some embodiments, a sensor module may be located in a air channel (duct) or cover of the heat exchanger and can measure the flow rate, temperature, and pressure of the air flow. The measurements of the air may include measurements of exhaust heat emitted through the air-cooling module using two or more thermodynamic variables (e.g., temperature and pressure). In some cases, the measurements can be calculated using a computing device.

The computing device may collect signals coming into the sensors. For example, sensor values may be supplied from a mounted sensor module and may measure heat dissipation through the signal processing unit. The data may be converted into an analog signal, and may be used to control the heat exchanger.

In some examples, a heat dissipation measurement takes into account the thermal characteristics of the air flow, and changes in existing conditions and differences in process conditions (i.e., temperature) can be corrected, thereby reducing the dispersion of deposition between wafers.

Referring to FIG. 2, the semiconductor deposition device 100 included in the semiconductor deposition monitoring device 10 of FIG. 1, according to some embodiments, includes a chamber 110, a facility cover 150, and pyrometers 160. Further, the semiconductor deposition monitoring device 10 of FIG. 1, according to some embodiments, includes the heat exchanger module 300, and the heat exchanger module 300 may be connected to the semiconductor deposition device 100 through the conduit 145.

The chamber 110 may include a chamber body 115 and a cover dome 110*c*. The chamber 110 may be a deposition chamber for growing a thin film on a deposition target, e.g., a wafer 200. For example, the chamber 110 may be a low-pressure chemical vapor deposition (LPCVD) chamber or a very LPCVD (VLPCVD) chamber for epitaxial growth or selective epitaxial growth (SEG). However, the chamber 110 is not limited to the aforementioned chambers. The chamber body 115 may have a cylindrical shape opened at the top and bottom thereof. For example, the chamber body 115 may have a circular band as a whole. However, the shape of the chamber body 115 is not limited thereto. For example, the chamber body 115 may have a shape of a polygonal cylinder. The chamber body 115 may be made of a metal material in part or in whole. For example, the chamber body 115 may be made of a metallic material such as aluminum or stainless steel.

The cover dome 110*c* may include an upper dome 110*u* and lower dome 110*d*. The upper dome 110*u* may be disposed above the chamber body 115 and have a dome shape that may be upwardly convex. The upper dome 110*u* may be connected at the lower part, i.e., edge, thereof to the upper surface of the chamber body 115 to define an upper region of a reaction space inside the chamber 110 in a sealing manner. The upper dome 110*u* may be attached to the chamber body 115 in the form of a detachable structure. Accordingly, the upper dome 110*u* may be separated from the chamber body 115 so the upper dome 110*u* may be cleaned or replaced.

The upper dome 110*u* may be made of a material capable of effectively transferring radiant heat energy of the light irradiated by a lamp 140 installed above the chamber 110 to the reaction space in the chamber 110. For example, the upper dome 110*u* may be made of transparent material such as quartz so ultraviolet (UV), visible, and infrared (IR) light may pass therethrough. However, the upper dome 110*u* is not limited in material to the quartz. For example, the upper dome 110*u* may be made of transparent ceramic. The upper dome 110*u* may also be made at least partly of a non-transparent material. The upper dome 110*u* may be made of a transparent material such that the radiant heat energy of the light irradiated from the lamp 140 penetrates the upper dome 110*u* to reach the reaction space inside the chamber 110.

The lower dome 110*d* may be attached to the lower surface of the chamber body 115 to define a lower region of the reaction space inside the chamber 110 in a sealing manner. The lower dome 110*d* may also be made of a transparent material such as quartz. Therefore, the lower dome 110*d* may effectively transfer the radiant heat energy of the light irradiated from the lamp 140 installed below the chamber 110 to the reaction space inside the chamber 110. The lower dome 110*d* may be made of transparent ceramic or may be at least partially made of a non-transparent material.

The lower dome 110*d* may include a bottom plate 110*d*-1 inclined downward and an extension pipe 110*d*-2 protruding and extending downward from the center of the bottom plate 110*d*-1. The bottom plate 110*d*-1 may have an upside-down conical shape opened at the top thereof. The extension pipe 110*d*-2 may have a circular cylindrical shape.

A supporting table 112 for placing a deposition target, e.g., the wafer 200, may be arranged at the center of the chamber 110. The supporting table 112 may be supported by a tripod or hexapod 114. A central shaft 114*c* of the tripod or hexapod 114 may extend downward through the extension pipe 110*d*-2 and may be connected to a rotational drive. Accordingly, the supporting table 112 may rotate at a predetermined speed by means of the rotational drive. The supporting table 112 may be referred to as susceptor at times.

A preheat ring 118 may be arranged around the circumference of the supporting table 112. An interposition member 119, such as a quartz ring, may be arranged close to the supporting table 112 on the inner surface of the chamber body 115. The interposition member 119 may constitute a part of the chamber body 115. Additionally or alternatively, the preheat ring 118 and the supporting table 112 may be arranged to have a gap G therebetween, as shown in FIG. 2, where process gases may flow into the reaction space below the supporting table 112.

The inner surface of the cover dome 110*c* may be coated with the by-product BP. For example, in the deposition process, the deposition material should be formed on the wafer 200 as a deposition target. However, the deposition material may be deposited, as the by-product BP, on the inner surface (e.g., inside the chamber 110) around the deposition target as well as the deposition target. The by-product BP coated the inner surface of the cover dome 110*c* made of a quartz material may serve as a cause of reduction of transfer of radiant heat energy from the lamp 140. For reference, the by-produce BP may differ according to the kind of thin film to be formed on the wafer. For example, in the case of using a silicon source gas such as $SiH_4$, $Si_2H_6$, $SiCl_2H_2$, $SiCl_3H$, and $SiCl_4$ for epitaxial growth of silicon (Si) on the wafer 200, the inner surface of the cover dome 110*c* may be coated with a silicon compound containing silicon as the by-product BP. Various kinds of thin films such as SiGe, SiC, and SiGeC may be epitaxially grown on the wafer 200.

A pressure adjustment device, a pressure measurement device, and various inspection and monitoring devices for checking the inner state of the chamber 110 may be installed inside and outside the chamber 110. For example, the controller 500 of FIG. 1 may adjust the conditions of the deposition process and the air flowing into the semiconductor deposition device 100 based on the deposition information received from the pressure adjustment device, the pressure measurement device, and other monitoring devices.

The chamber 110, particularly the chamber body 115, may be provided with a gas inlet Gin and a gas outlet Gout for inflow and outflow of the process gases. The gas inlet Gin and the gas outlet Gout may be arranged at opposite sides. However, the gas inlet Gin and the gas outlet Gout are not limited in position to the aforementioned example.

The lamp 140 may be arranged above or below the chamber 110. The lamp 140 may irradiate light to provide radiant heat energy used for the deposition process to the inside of the chamber 110. For example, the lamp 140 may be a halogen lamp. A plurality of lamps 140 may be arranged above and below the chamber 110. For example, dozens of lamps 140 may be arranged on each of upper and lower portions of the chamber 110 to facilitate an increase in temperature of the wafer 200 up to 1200° C. in the chamber 110. In some examples, a plurality of lamp reflection plates may be arranged inside the facility cover 150 in various forms to facilitate an effective provision of the light from the lamp 140 into the chamber 110.

The lamp 140 may include an ultraviolet (UV) lamp in some cases. The UV lamp may be a mercury-based (Hg-based) arc lamp. The UC lamp may serve to sufficiently excite (activate the state of) the aforementioned silicon source gas, HCl and $H_2$ gases and the like rather than to increase the temperature inside the chamber 110.

The facility cover 150, as a kind of housing, may support the chamber 110 and surround the chamber 110 to insulate the chamber 110 from the outside. The facility cover 150 may provide the lamp 140 the ability to be installed and supported on the inside thereof. The facility cover 150 may be made of a metal material. However, the facility cover 150 is not limited in material to metal. A viewport may be installed on the facility cover 150 so that the inside of the chamber 110 can be seen from the outside.

The pyrometers 160 may include an upper pyrometer 160*u* arranged on the top surface of the facility cover 150. A lower pyrometer 160*d* arranged on the bottom surface of the facility cover 150. Of course, the pyrometers 160 are not limited in position and number to the aforementioned example. The pyrometers 160 may each be a contactless optical pyrometer. The optical pyrometer measures the temperature by comparing the luminance of a measurement target with the luminance of a standard lamp, and may be used to measure the temperature of a hot object, particularly a hot object into which a thermometer cannot be directly inserted. However, the pyrometer 160 is not limited to the optical pyrometer. For example, the pyrometer 160 may be a radiation pyrometer using radiant heat or a photoelectric pyrometer using a photocurrent generated by radiation.

The controller 500 of the semiconductor deposition monitoring device 10 of FIG. 1, according to some embodiments, may measure the temperature inside the chamber 110 in a contactless manner using the pyrometers 160 arranged above and below the facility cover 150. Given that the pyrometer 160 basically uses light inside the chamber 110, the light inside the chamber 110 should be accurately transmitted to the pyrometer 160 through the cover dome 110*c*. However, if the inner surface of the cover dome 110*c* is coated with the by-product BP, the by-product BP may obstruct penetration of the light, which is likely to cause a temperature measurement error of the pyrometer 160. The temperature condition for the deposition process may be difficult to maintain due to the temperature measurement error of the pyrometer 160, leading to a deposition process error.

However, the semiconductor deposition monitoring device, according to some embodiments, includes a plurality of sensors (e.g., pressure sensors 310*u* and 310*d*, temperature sensors 320*u*1, 320*u*2, 320*d*1, and 320*d*2, and/or speed sensors 330*u*1, 330*u*2, 330*d*1, and 330*d*2) disposed in the conduit 145, an optical sensor 400, and/or a laser sensor 120*h* to be described later with reference to FIG. 9. Accordingly, the state of the by-product BP on the inner surface of the cover dome 110*c* may be checked in real-time during the deposition process and adjust the process condition or perform temperature correction of the pyrometer 160 based on the state of the by-product BP, thereby preventing a deposition process error in advance.

In a case where there is no sensor capable of detecting the state of the by-product BP coated on the inner surface of the cover dome 110*c*, the chamber 110 may be disassembled to check that, with naked eyes or perform actual measurement on the corresponding wafer, after the completion of the deposition process to determine whether the deposition process is erroneous. However, checking with naked eyes or performing actual measurement imposes much time and costs, which may be very disadvantageous from the standpoint of mass production of semiconductor devices.

In this regard, the semiconductor deposition monitoring device according to some embodiments includes, as described above, the plurality of sensors (e.g., pressure sensors 310*u* and 310*d*, temperature sensors 320*u*1, 320*u*2, 320*d*1, and 320*d*2, and speed sensors 330*u*1, 330*u*2, 330*d*1, and 330*d*2) disposed in the conduit 145, the optical sensor 400, and/or the laser sensor 120*h* to be described later with reference to FIG. 9, thereby improving the mass productivity of semiconductor devices.

Descriptions are made in detail of the plurality of sensors (e.g., pressure sensors 310*u* and 310*d*, temperature sensors 320*u*1, 320*u*2, 320*d*1, and 320*d*2, and/or speed sensors 330*u*1, 330*u*2, 330*d*1, and 330*d*2) and the optical sensor 400 arranged in the conduit 145 of the semiconductor deposition monitoring device according to some embodiments.

The semiconductor deposition device 100 may receive air from the heat exchanger module 300 through the conduit 145. The semiconductor deposition device 100 may also transfer the air to the heat exchanger module 300 through the conduit 145.

In more detail, the heat exchanger module 300 includes a heat exchanger 340, an upper blower 350*u*, and a lower blower 350*d*. The upper blower 350*u* may be arranged between an upper inlet conduit 145*iu* and the heat exchanger 340. For example, the upper blower 350*u* may adjust the temperature of the air such that the air with the heat quantity calculated by the heat exchanger 340 is transferred to the upper dome 110*u* through the upper inlet conduit 145*iu*. The lower blower 350*d* may also adjust the temperature of the air such that the air with the heat quantity calculated by the heat exchanger 340 is transferred to the lower dome 110*d* through a lower inlet conduit 145*id*.

The heat exchanger module 300 may improve independence of the chamber 110 from a change in atmospheric procedure and uniformly maintain the temperature of the chamber 110 based on the information of the air exchanged with the semiconductor deposition device 100 in real-time.

The heat exchanger module 300 is described in more detail with reference to FIG. 3 hereinafter.

Figure 3:
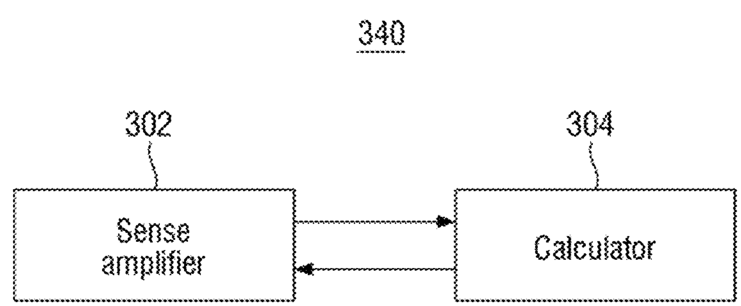
FIG. 3 is a block diagram illustrating a heat exchanger according to some embodiments.

FIG. 3 is a block diagram illustrating a heat exchanger according to some embodiments.

Referring to FIGS. 2 and 3, the heat exchanger 340 of the heat exchanger module 300 includes a sensing amplifier 302 and a calculator 304.

The conduit 145 includes the upper inlet conduit 145*iu* through that the air IN1 flows in the upper dome 110*u*. The conduit 145 further includes an upper outlet conduit 145*ou* through which the air OUT1 flows out of the upper dome 110*u*. The conduit 145 further includes a lower inlet conduit 145*id* through which the air IN2 flows in the lower dome 110*d*. The conduit 145 further includes a lower outlet conduit 145*od* through which the air OUT2 flows out of the lower dome 110*d*. The air may be a coolant.

The upper inlet conduit 145*iu* includes therein an upper inflow temperature sensor 320 *u*1 and an upper inflow speed sensor 330*u*1. The upper outlet conduit 145*ou* includes therein an upper pressure sensor 310*u*, and an upper outflow temperature sensor 320*u*2, and an upper outflow speed sensor 330*u*2. The lower inlet conduit 145*id* includes therein a lower inflow temperature sensor 320*d*1 and a lower inflow speed sensor 330*d*1. The lower outlet conduit 145*od* includes therein a lower pressure sensor 310*d*, a lower outflow temperature sensor 320*d*2, and a lower outflow speed sensor 330*d*2.

The upper pressure sensor 310*u* senses the pressure of the air flowing out of the upper dome 110*u* through the upper outlet conduit 145*ou*. The lower pressure sensor 310*d* senses the pressure of the air flowing out of the lower dome 110*d* through the lower outlet conduit 145*od*.

The upper inflow temperature sensor 320*u*1 senses the temperature of the air flowing in the upper dome 110*u* through the upper inlet conduit 145*iu*. The upper outflow temperature sensor 320*u*2 senses the temperature of the air flowing out of the upper dome 110*u* through the upper outlet conduit 145*ou*. The lower inflow temperature sensor 320*d*1 senses the temperature of the air flowing in the lower dome 110*d* through the lower inlet conduit 145*id*. The lower outflow temperature sensor 320*d*2 senses the temperature of the air flowing out of the lower dome 110*d* through the lower outlet conduit 145*od*.

The upper inflow speed sensor 330*u*1 senses the speed of the air flowing in the upper dome 110*u* through the upper inlet conduit 145*iu*. The upper outflow speed sensor 330*u*2 senses the speed of the air flowing out of the upper dome 110*u* through the upper outlet conduit 145*ou*. The lower inflow speed sensor 330*d*1 senses the speed of the air flowing in the lower dome 110*d* through the lower inlet conduit 145*id*. The lower outflow speed sensor 330*d*2 senses the speed of the air flowing out of the lower dome 110*d* through the lower outlet conduit 145*od*.

For reference, the sensors (e.g., upper pressure sensor 310*u*, lower pressure sensor 310*d*, upper inflow temperature sensor 320*u*1, upper outflow temperature sensor 320*u*2, lower inflow temperature sensor 320*d*1, lower outflow temperature sensor 320*d*2, upper inflow speed sensor 330*u*1, upper outflow speed sensor 330*u*2, lower inflow speed sensor 330*d*1, and lower outflow speed sensor 330*d*2) are not limited in position inside the conduit 145 and in number to the example shown in FIG. 2.

The sensing amplifier 302 may amplify the sensing values received from the sensors (e.g., upper pressure sensor 310*u*, lower pressure sensor 310*d*, upper inflow temperature sensor 320*u*1, upper outflow temperature sensor 320*u*2, lower inflow temperature sensor 320*d*1, lower outflow temperature sensor 320*d*2, upper inflow speed sensor 330*u*1, upper outflow speed sensor 330*u*2, lower inflow speed sensor 330*d*1, and lower outflow speed sensor 330*d*2). The sensing amplifier 302 is described in more detail with reference to FIG. 4.

Figure 4:
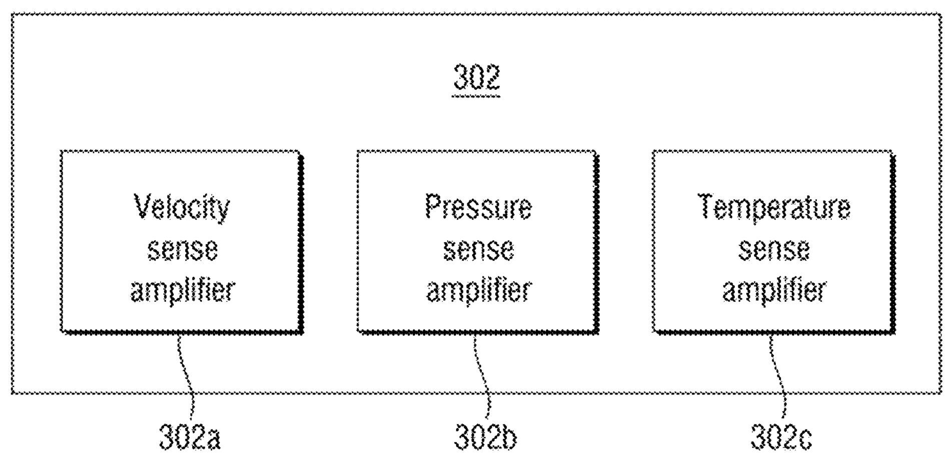
FIG. 4 is a block diagram illustrating a sensing amplifier according to some embodiments.

FIG. 4 is a block diagram illustrating a sensing amplifier according to some embodiments.

Referring to FIG. 4, the sensing amplifier 302 includes a speed sensing value amplifier 302*a*, a pressure sensing value amplifier 302*b*, and a temperature sensing value amplifier 302*c*. The sensing amplifier 302 is not limited in configuration thereto.

For example, the pressure sensing value amplifier 302*b* amplifies the value of the pressure of the air flowing out of the upper dome 110*u* through the upper outlet conduit 145*ou*. The pressure may be sensed by the upper pressure sensor 310*u*.

The pressure sensing value amplifier 302*b* also amplifies the value of the pressure of the air flowing out of the lower dome 110*d* through the lower outlet conduit 145*od*. The pressure may be sensed by the lower pressure sensor 310*d*. The temperature sensing value amplifier 302*c* amplifies the value of the temperature of the air flowing in the upper dome 110*u* through the upper inlet conduit 145*iu*. The temperature may be sensed by the upper inflow temperature sensor 320*u*1. The temperature sensing value amplifier 302*c* also amplifies the value of the temperature of the air flowing out of the upper dome 110*u* through the upper outlet conduit 145*ou*. The temperature may be sensed by the upper outflow temperature sensor 320*u*2. The temperature sensing value amplifier 302*c* also amplifies the value of the temperature of the air flowing in the lower dome 110*d* through the lower inlet conduit 145*id*. The temperature may be sensed by the lower inflow temperature sensor 320*d*1. The temperature sensing value amplifier 302*c* also amplifies the value of the temperature of the air flowing out of the lower dome 110*d* through the lower outlet conduit 145*od*. The temperature may be sensed by the lower outflow temperature sensor 320*d*2.

The speed sensing value amplifier 302*a* amplifies the value of the speed of the air flowing in the upper dome 110*u* through the upper inlet conduit 145*iu*. The speed may be sensed by the upper inflow speed sensor 330*u*1. The speed sensing value amplifier 302*a* also amplifies the value of the speed of the air flowing out of the upper dome 110*u* through the upper outlet conduit 145*ou*. The speed may be sensed by the upper outflow speed sensor 330*u*2. The speed sensing value amplifier 302*a* also amplifies the value of the speed of the air flowing in the lower dome 110*d* through the lower inlet conduit 145*id*. The speed may be sensed by the lower inflow speed sensor 330*d*1. The speed sensing value amplifier 302*a* also amplifies the value of the speed of the air flowing out of the lower dome 110*d* through the lower outlet conduit 145*od*. The speed may be sensed by the lower outflow speed sensor 330*d*2.

Referring back to FIGS. 2 and 3, the heat exchanger module 300, particularly the heat exchanger 340 of the heat exchanger module 300, may calculate, using the calculator 304, the heat quantity of the air flowing through the conduit 145 based on the sensing values amplified by the sensing amplifier 302. The heat exchanger module 300 may calculate the heat quantity of the air based on the non-amplified sensing values without amplifying the sensing values.

In some examples, the calculator 304 may include a data acquisition (DAQ) circuit for collecting the sensing values from the plurality of aforementioned sensors, a signal processing device for converting the collected sensing values into an electrical signal, and a digital-analog converter (DAC) for converting the electrical signal into an analog signal. The calculator 304 is not limited in configuration thereto.

For example, the calculator 304 collects the sensing values from the plurality of aforementioned sensors, converts the collected sensing values into an electrical signal, and calculates the heat quantity of the air flowing through the conduit 145 based on the electrical signal. In some embodiments, the calculator 304 may adjust an operation condition of an air-cooling module by converting the electrical signal into an analog signal based on the calculated heat quantity of the air. For example, the calculator 304 may decrease the temperature of the air flowing through the conduit 145 if the heat quantity of the air is determined to be high. Additionally, or alternatively, the calculator 304 may increase the temperature of the air flowing through the conduit 145 if the heat quantity of the air is determined to be low.

Additionally, or alternatively, a temperature change of the air flowing in the chamber 110 may be reduced, where the change may be caused by external conditions, for different deposition devices to remain at the same temperature in real-time.

For reference, although FIGS. 1 and 2 show that the heat exchanger 340 is arranged outside the controller 500, the present disclosure is not limited thereto. The heat exchanger 340 may be arranged inside the controller 500, such that the controller 500 controls overall operations of the heat exchanger 340. Additionally, or alternatively, the controller 500 may collect the sensing values from the plurality of sensors, convert the collected sensing values into an electrical signal, and transfer the electrical signal to the heat exchanger 340.

Figure 5:
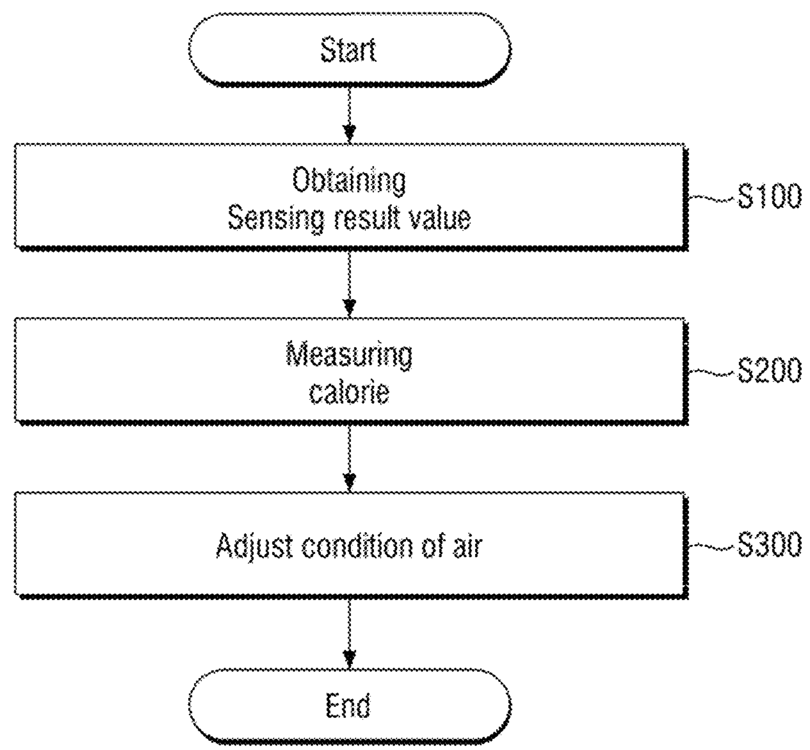
FIG. 5 is a flowchart illustrating an operation of a heat exchanger according to various embodiments.

A description is made of the operation of the heat exchanger module 300 with reference to a flowchart of FIG. 5.

FIG. 5 is a flowchart illustrating an operation of a heat exchanger according to various embodiments.

Referring to FIGS. 1, 2, and 5, first, the heat exchanger module 300 or the controller 500 collects sensing values from the plurality of sensors (e.g., upper pressure sensor 310*u*, lower pressure sensor 310*d*, upper inflow temperature sensor 320*u*1, upper outflow temperature sensor 320*u*2, lower inflow temperature sensor 320*d*1, lower outflow temperature sensor 320*d*2, upper inflow speed sensor 330*u*1, upper outflow speed sensor 330*u*2, lower inflow speed sensor 330*d*1, and lower outflow speed sensor 330*d*2) to adjust the temperature of the air flowing in the chamber 110 (step S100).

Next, the heat exchanger module 300 or the controller 500 calculates the heat quantity of the air based on the collected sensing values (step S200).

The heat exchanger module 300 or the controller 500 may adjust the condition of the air based on the heat quantity of the air (step S300). For example, the heat exchanger module 300 or the controller 500 may decrease the air temperature flowing through the conduit 145 based on the determination that the air temperature is high. Additionally, or alternatively, the heat exchanger module 300 or the controller 500 may increase the air temperature flowing through the conduit 145 based on the determination that the air's heat quantity is low.

The heat exchanger module 300 may convert an electrical signal related to an adjustment temperature into an analog signal to adjust an operation condition of the air-cooling module. Additionally, or alternatively, the controller 500 may transmit an electrical signal related to an adjustment temperature to the heat exchanger module 300 for the heat exchanger module 300 to convert the electrical signal related to the adjustment temperature into an analog signal to adjust the operation condition of the air-cooling module. Additionally, or alternatively, the controller 500 may convert the electrical signal related to the adjustment temperature into an analog signal to adjust the operation condition of the air-cooling module.

Referring to back to FIGS. 1 and 2, the semiconductor deposition device 100 of the semiconductor deposition monitoring device 10, according to some embodiments, includes the optical sensor 400.

The optical sensor 400, i.e., optical sensors 400*a* and 400*b*, may be arranged at the top and bottom of the chamber 110. The optical sensor 400 may measure a state of the by-product BP on the inner surface of the upper dome 110*u* and/or lower dome 110*d* based on a change of the light irradiated from the lamp 140 after being reflected from the upper dome 110*u* and/or the lower dome 110*d*.

Figure 6:
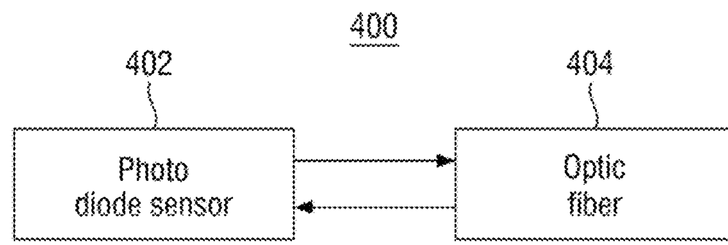
FIG. 6 is a block diagram illustrating an optical sensor according to some embodiments.

A description is made of the configuration of the optical sensor 400 with reference to FIG. 6.

FIG. 6 is a block diagram illustrating an optical sensor according to some embodiments.

Referring to FIGS. 2 and 6, the optical sensor 400 includes a photo diode 402 and an optical fiber 404.

The optical fiber 404 may receive the light emitted from the lamp 140 and/or the light irradiated from the lamp 140 and then reflected by the upper dome 110*u* and/or the lower dome 110*d*. The optical fiber 404 may be a glass or plastic fiber, but the optical fiber 404 is not limited in material thereto.

Conventional deposition equipment does not include an optical sensor that detects the deterioration of apparatus (e.g., in the lower quartz process kit). However, according to embodiments of the present disclosure, the optical fiber 404 collects and transmits the light of light, photo diode sensor that converts it into an electrical signal for detecting deposition material or degradation. In some examples, a sensor module is configured as a control device that calculates and determines the degree of degradation and controls feedback for airflow accordingly.

The photo diode 402 may convert the light received from the optical fiber 404 into an electrical signal. The photo diode 402 may have a PN junction or PIN structure, but the photo diode 402 is not limited in structure thereto.

Figure 7:
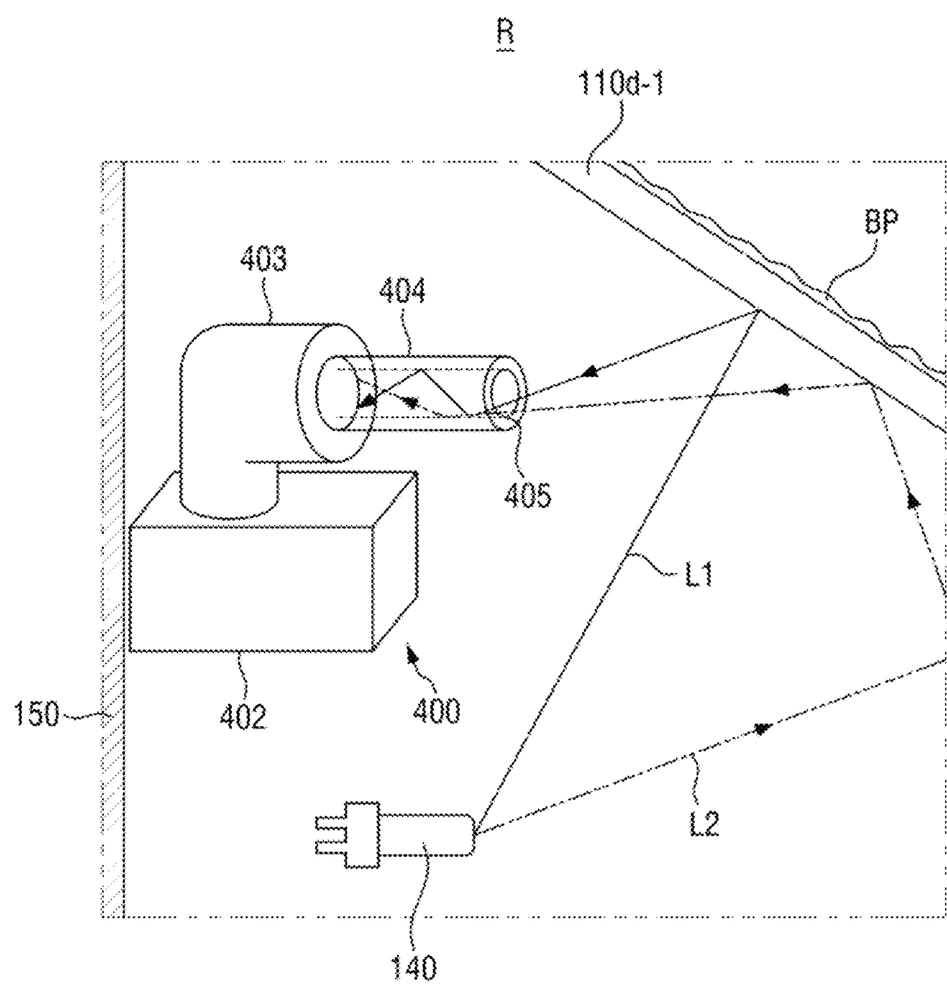
FIG. 7 is an enlarged view of area R of FIG. 2.

A description is made of the light-receiving operation of the optical sensor 400 with reference to FIG. 7.

FIG. 7 is an enlarged view of area R of FIG. 2.

Referring to FIGS. 1, 2, and 7, area R of FIG. 2 is enlarged for explanation of the operation of the optical sensor 400.

As described above, the optical sensor 400 may include the photo diode 402 and the optical fiber 404, in which a connection member 403 may be arranged between the photo diode 402 and the optical fiber 404. The optical sensor 400 is not limited in structure and shape to the example in FIG. 7. For example, the photo diode 402 and the optical fiber 404 may be directly connected with each other without the connection member 403.

The light irradiated from the lamp 140 may be reflected by the extension pipe 110*d*-2 and the bottom plate 110*d*-1 to be conducted into the optical fiber 404 (see L2). Additionally, or alternatively, the light irradiated from the lamp 140 may be reflected by the bottom plate 110*d*-1 so as to be conducted into the optical fiber 404 (see L1).

The optical fiber 404 may include therein a core 405 with a high refractive index. For example, the optical fiber 404 may be formed as a glass fiber of which the inner and outer parts differ in density and refractive index. As a result, the light irradiated from the lamp 140 may propagate under total reflection. For example, the information contained in the light irradiated from the lamp 140 may be transferred to the photo diode 402 without any loss.

As described above, the by-product BP may be produced inside the cover dome 110c and the by-product BP may obstruct penetration of the light emitted by the pyrometer 160, leading to a temperature measurement error. Therefore, checking the by-product BP produced inside the cover dome 110c in real-time may be performed.

For example, the optical sensor 400 provides the ability to check the by-product BP produced inside the cover dome 110c in real-time by analyzing the light irradiated directly from the lamp 140 and the light (e.g., L1 and L2) arriving after being reflected from the cover dome 110c. Based on the state of the by-product BP checked by the optical sensor 400, the controller 500 and/or the heat exchanger module 300 may adjust the process condition (e.g., intensity of the light irradiated from the lamp 140) of the semiconductor deposition device 100.

The controller 500 may check, for example, the state of the by-product BP based on the detected intensity of the light and determine whether the state of the by-product BP is in a tolerance range. The thickness of the by-product BP may be determined to be within the tolerance range by calculating the thickness of the by-product BP based on the detected intensity of the light. For example, the intensities of the light detected during the deposition process may be categorized into percentages (%) compared with the intensity of the light detected in the state where no by-product BP is coated on the cover dome 110c. The thickness of the by-product BP may be quantified in association with the corresponding percentage (%). After the quantification, if the intensity of the light is detected, the thickness of the by-product BP may be determined by comparing the detected intensity of the light with the initial intensity of the light.

Further, the controller 500 may determine, for example, whether the temperature indicated by the pyrometer 160 is correct within the tolerance range in association with the detected intensity of the light. As can be seen from FIG. 2, if the by-product BP is thickly coated on the cover dome 110c, the temperature measurement of the pyrometer 160 may be erroneous. In this regard, the temperature change may be quantified based on the intensity of the light and set a tolerance range of difference between the temperature measured by the pyrometer 160 and the actual temperature, similar to quantifying the thickness of the by-product BP. If the difference between the temperature measured by the pyrometer 160 and the actual temperature is out of the tolerance range, the controller 500 may correct the temperature indicated by the pyrometer 160 based on the detected intensity of the light. Further, the controller 500 may control the lamp 140 to adjust the temperature inside the chamber to a desired temperature.

The controller 500 may also adjust the process condition of the deposition process according to the detected intensity of the light or the state of the by-product. Further, the controller 500 may determine a wet cleaning timing, a dry cleaning method, or a replacement timing of the cover dome 110c based on the detected intensity of the light or the state of the by-product. Here, the wet cleaning timing may denote the timing for separating the cover dome 110c from the chamber body 115 to perform the wet cleaning. The dry cleaning method may denote setting an endpoint of cleaning in the dry cleaning. For example, the endpoint of the cleaning may be set to about 10 seconds for the case where the thickness of the by-product is thin and about 15 seconds for the case where the thickness of the by-product is relatively thick.

Figure 8:
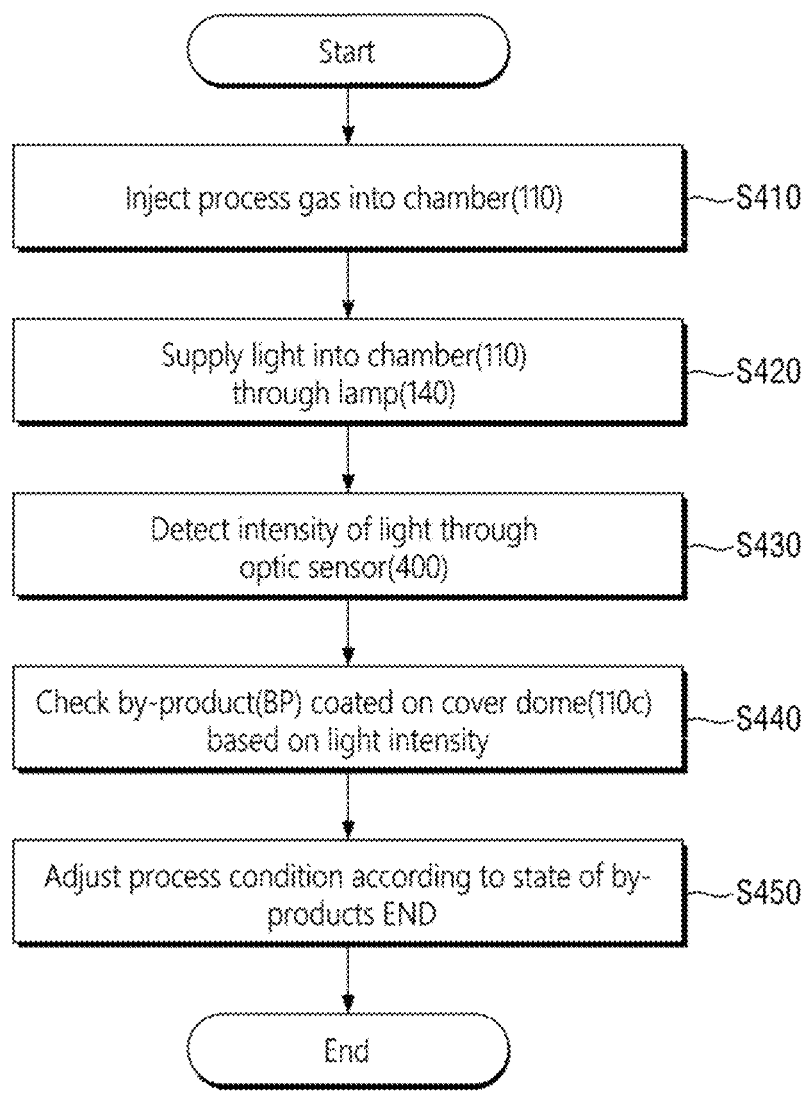
FIG. 8 is a flowchart illustrating an operation of an optical sensor according to some embodiments.

A description is made of a monitoring method of a semiconductor deposition device via the optical sensor 400 with reference to the flowchart of FIG. 8.

FIG. 8 is a flowchart illustrating an operation of an optical sensor according to some embodiments.

Referring to FIGS. 2, 7, and 8, a process gas is first injected into the chamber 110 for the deposition process (step S410). The process gas may be injected through the gas inlet Gin. The process gas may vary according to the material of the thin film to be formed on the deposition target (e.g., wafer 200). For example, in the case of forming a silicon thin film, silicon source gases may be injected as the process gas.

Next, by irradiating light using the lamp 140, radiant heat energy is supplied into the chamber 110 (step S420). The light irradiation step S420 using the lamp 140 and the process gas injection step S410 may be performed simultaneously or in the reverse order.

Next, the intensity of the light is detected by the optical sensor 400 (step S430).

Next, the state of the by-product BP coated on the cover dome 110c may be checked based on the intensity of the light detected by the optical sensor 400 (step S440). The intensity of the light irradiated from the lamp 140 may vary according to the amount or thickness of the by-product BP formed on the cover dome 110c. For example, embodiments of the present disclosure may accurately measure the state of the by-product BP coated on the cover dome 110c based on the intensity of the light collected by the optical sensor 400.

Finally, the process condition is adjusted by the controller 500 and/or the heat exchanger module 300 based on the state of the by-product BP (step S450). For example, if the state of the by-product BP is determined to be out of the tolerance range, adjust the process condition may be adjusted or the cover dome 110c may be cleaned or replaced by means of the controller 500. Additionally, or alternatively, if the state of the by-product BP is determined to be out of the tolerance range, the temperature of the air flowing in the chamber 110 may be adjusted by the heat exchanger module 300.

Figure 9:
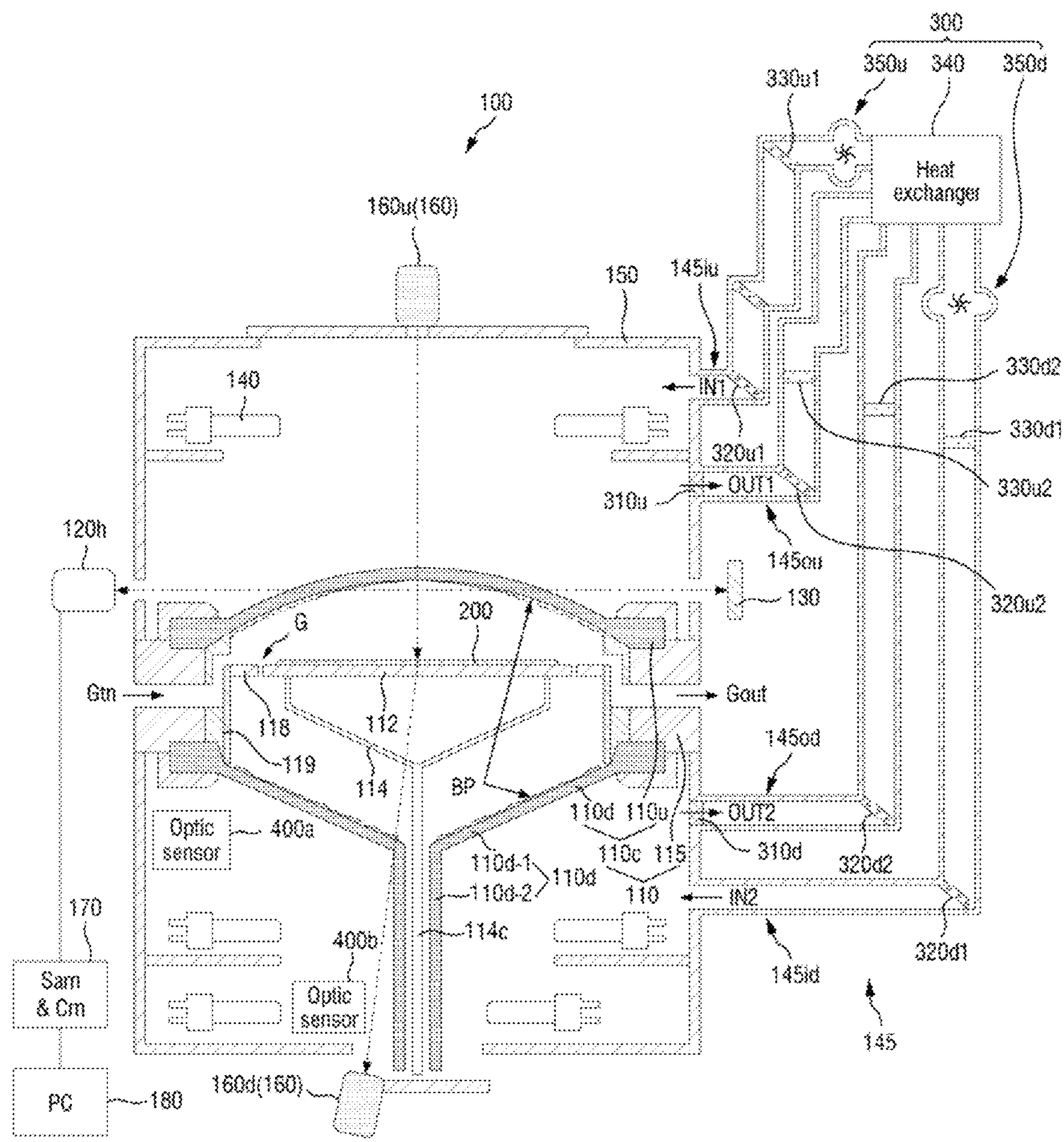
FIG. 9 is another diagram illustrating a semiconductor deposition device and a heat exchanger module of a semiconductor deposition monitoring device according to some embodiments.

FIG. 9 is another diagram illustrating a semiconductor deposition device and a heat exchanger module of a semiconductor deposition monitoring device according to some embodiments. The following description is related to differences from the above descriptions to avoid redundancy.

Referring to FIG. 9, a configuration for measuring the by-product BP inside the upper dome 110u with a laser beam is added in comparison with FIG. 2.

Inside the lower dome 110d of the semiconductor deposition device 100, there are other physical structures such as the tripod or hexapod 114 and the central shaft 114c in addition to the lower dome 110d. The physical structures may prevent the use of a laser beam for measurement of the by-product BP inside the lower dome 110d. In this case, the by-product BP may be measured inside the lower dome 110d using the optical sensor 400, as shown in FIGS. 2 and 9.

In the case of the upper dome 110u, the by-product BP may be measured inside the upper dome 110u using a laser beam because there are no other physical structures with the exception of the upper dome 110u. For example, the semiconductor deposition monitoring device of FIG. 2, according to some embodiments, uses the optical sensor for measurement of the by-product BP inside both the upper and lower domes 110u and 110d. Additionally, or alternatively, the semiconductor deposition monitoring device of FIG. 9, according to some embodiments, has a difference in using the laser beam for measurement of the by-product BP inside the upper dome 110*u* and the optical sensor 400 for measurement of the by-product BP inside the lower dome 110*d*.

Accordingly, the description, with reference to FIG. 9, is related to the detection of the by-product BP inside the upper dome 110*u* with the laser beam.

A laser sensor 120*h* may be arranged on the outer side surface of the facility cover 150. The laser sensor 120*h* may irradiate a laser beam to the cover dome 110*c*, e.g., upper dome 110*u* to detect the intensity of the laser beam penetrated through the upper dome 110*u*. For example, the laser sensor 120*h* may be a horizontal type laser sensor for irradiating the laser beam horizontally in parallel with the top surface of the wafer 200 as a measurement target as indicated by a dotted arrow, and may detect the intensity by receiving the laser beam reflected by a reflection plate 130. In the semiconductor deposition monitoring device according to some embodiments, the laser sensor 120*h* is arranged at an upper part of the chamber body 115 for the laser beam to penetrate the upper dome 110*u*, but the laser sensor 120*h* is not limited in arrangement position thereto. For example, the laser sensor 120*h* may be arranged at a lower part of the chamber body 115 for the laser beam to penetrate the lower dome 110*d*.

The reflection plate 130 is arranged on the outer side surface of the facility cover 150, and may be disposed on the side surface of the facility cover 150 to oppositely face the laser sensor 120*h* across the chamber 110. For example, the reflection plate 130 may be arranged at a position available for reflecting the laser beam from the laser sensor 120*h*. The reflection plate 130 may be made of plastic with a superior reflective property. However, the reflection plate 130 is not limited in material to plastic. For example, the reflection plate 130 may be made of a material such as metal.

In the semiconductor deposition monitoring device, according to some embodiments, the reflection plate 130 may have a retro-reflective property. Here, the retro-reflection may refer to a reflection of the irradiated beam back to the light source. Accordingly, the reflection plate 130 reflects the light, regardless of the incident direction and angle of the light, back to the light source. For example, the reflection plate 130 may reflect the laser beam irradiated from the laser sensor 120*h* back to the laser sensor 120*h*. The reflection plate 130 may be formed in a structure obtained by uniformly coating a fabric or a film with fine glass beads, or a microprism structure obtained by coating a polymer film with cube microprisms for retro-reflection.

The reflection plate 130 may reflect the incident light so as to be polarized at an angle of 90 degrees. The polarization function of the reflection plate 130 may contribute to the effective detection of the laser beam by the laser sensor 120*h*.

Although the reflection plate 130 may have both the retro-reflective property and 90-degree polarization property, the reflection plate 130 may also have one of the retro-reflective property and 90-degree polarization property. Additionally, or alternatively, the reflection plate 130 may have neither the retro-reflective property or 90-degree polarization property and may reflect light.

A sensor amplification and communication module 170 may be electrically connected to the laser sensor 120*h* and may receive a signal from the laser sensor 120*h* and amplify the received signal. Here, the signal may be a signal indicative of the intensity of the laser beam detected by a light receiving member of the laser sensor 120*h*. The sensor amplification and communication module 170 may transmit the amplified signal to the outside through a wireless or wireline connection. Here, the outside may be, for example, an analysis and control computer 180 and/or the controller 500.

The analysis and control computer 180 and/or the controller 500 may be connected to the sensor amplification and communication module 170 through the wireless or wireline connection so as to receive the amplified signal. The analysis and control computer 180 and/or the controller 500 may also analyze the received signal and control the overall operations of the semiconductor deposition monitoring device based on a result of the analysis according to some embodiments.

The analysis and control computer 180 and/or the controller 500 may, for example, check the state of the by-product BP based on the detected intensity of the laser beam to determine whether the state of the by-product BP is within the tolerance range. In detail, the analysis and control computer 180 and/or the controller 500 calculates the thickness of the by-product BP based on the detected intensity of the laser beam to determine whether the thickness of the by-product BP is within the tolerance range. Further, the analysis and control computer 180 and/or the controller 500 may quantify the thickness of the by-product BP according to the detected intensity of the laser beam. For example, the intensities of the laser beam detected during the deposition process may be categorized into percentages (%) in comparison with the intensity of the laser beam detected in the state where no by-product BP is coated on the cover dome 110*c* and quantify the thickness of the by-product BP in association with the corresponding percentage (%). After the quantification, if the intensity of the laser beam is detected, the thickness of the by-product BP may be determined by comparison with the initial laser beam. In the case where the tolerance range of the thickness of the by-product BP is determined, the thickness of the by-product BP may be determined to be within the tolerance range by checking the thickness as described above.

The checking may be carried out with a concept of a state of a thin film on the wafer rather than a state of the by-product BP. For example, the thickness of the thin film may be calculated or quantified based on to the detected intensity of the laser beam. Additionally, or alternatively, the thickness of the thin film may be determined to be within a tolerance range in the corresponding deposition process. However, the state of the by-product BP and the state of the thin film may be opposite concepts. For example, as the thickness of the by-product BP increases, the detected intensity of the laser beam decreases, and the deposition process is ill-performed such that the thickness of the thin film is likely to be too thin. Additionally, or alternatively, as the thickness of the by-product BP decreases, the detected intensity of the laser beam increases and the deposition process is performed such that the thickness of the thin film is likely to be sufficiently thick.

The analysis and control computer 180 and/or the controller 500 may determine whether the temperature indicated by the pyrometer 160 is correct within the tolerance range based on the intensity of the detected intensity of the laser beam. If the by-product BP coated on the cover dome 110*c* is thick, there may be a temperature measurement error of the pyrometer 160. In this regard, the temperature change may be quantified in association with the intensity of the laser beam and determine a tolerance range of difference between the temperature measured by the pyrometer 160 and the actual temperature, similar to quantifying the thickness of the by-product BP. If the difference between the temperature measured by the pyrometer 160 and the actual temperature is out of the tolerance range, the analysis and control computer 180 and/or the controller 500 may correct the temperature indicated by the pyrometer 160 based on the detected intensity of the laser beam. Further, the analysis and control computer 180 and/or the controller 500 may control the lamp 140 to adjust the temperature inside the chamber to a desired temperature.

The analysis and control computer 180 and/or the controller 500 may also adjust the process condition of the deposition process according to the detected intensity of the laser beam or the state of the by-product. Further, the analysis and control computer 180 may determine a wet cleaning timing, a dry cleaning method, or a replacement timing of the cover dome 110*c* based on the detected intensity of the laser beam or the state of the by-product. Here, the wet cleaning timing may denote the timing for separating the cover dome 110*c* from the chamber body 115 to perform the wet cleaning. The dry cleaning method may denote setting an endpoint of cleaning in the dry cleaning. For example, the endpoint of the cleaning may be set to about 10 seconds for the case where the thickness of the by-product is thin and about 15 seconds for the case where the thickness of the by-product is relatively thick.

Figure 10:
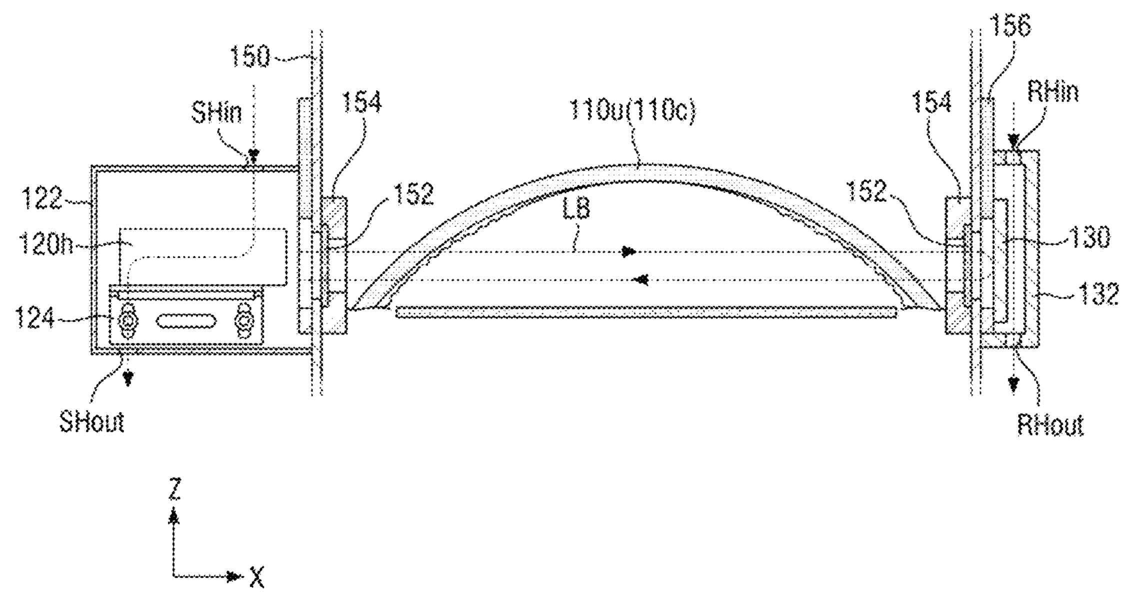
FIG. 10 is a diagram for explaining a detailed operation of a laser sensor according to some embodiments.

A description is made of the operation of checking the state of the by-product BP with a laser beam in detail with reference to FIG. 10.

FIG. 10 is a diagram for explaining a detailed operation of a laser sensor according to some embodiments.

Referring to FIGS. 9 and 10, the laser sensor 120*h* may be arranged on the left sidewall of the facility cover 150 and surrounded by a sensor cover 122. Further, the laser sensor 120*h* may be arranged on a bracket 124 and supported by the bracket 124.

A laser beam LB irradiated from the laser sensor 120*h* may penetrate the cover dome 110*c* corresponding to the upper dome 110*u* to reach the reflection plate 130. The laser beam LB may be reflected by the reflection plate 130 and penetrate the cover dome 110*c* again to arrive at the laser sensor 120*h*.

The sensor cover 122 may have an air inlet hole SHin formed on the top surface thereof and an air outlet hole SHout formed on the bottom surface thereof. As indicated by the dotted arrow, a coolant gas may be injected through the air inlet hole SHin to cool the laser sensor 120*h* and then discharged through the air outlet hole SHout. The bracket 124 may support the laser sensor 120*h* and serve to adjust the horizontal and vertical positions of the laser sensor 120*h*.

The reflection plate 130 may be arranged on the right sidewall of the facility cover 150 and surrounded by a reflection plate cover 132. The reflection plate cover 132 may have an air inlet hole RHin formed on the top surface thereof and an air outlet hole RHout formed on the bottom surface thereof. As indicated by the dotted arrow, a coolant gas may be injected through the air inlet hole RHin to cool the reflection plate 130 and then discharged through the air outlet hole RHout.

An infrared (IR) filter 152 may be arranged at the viewport parts of the facility cover 150 at which the laser sensor 120*h* and the reflection plate 130 are located. The IR filter 152 may block infrared light from the inside of the chamber 110. For example, the IR filter 152 may pass an electromagnetic wave such as ultraviolet (UV) light and visible light but filter out an electromagnetic wave with a long wavelength such as infrared (IR) light. The IR filter 152 may be connected to the inner surface of the facility cover 150 via a filter connecting member 154. However, the present disclosure is not limited thereto, and the IR filter 152 may be connected to the outer surface of the facility cover 150.

As the IR filter 152 is arranged on the facility cover 150, the infrared (IR) light as a heat ray is blocked from being incident on the laser sensor 120*h* and the reflection plate 130, which may protect the laser sensor 120*h* and the reflection plate 130 and improve laser beam detection performance.

A shutter 156 may be arranged to be connected to the outer surface of the viewport parts of the facility cover 150. The shutter 156 may be made of a metal material to block the electromagnetic wave from the inside of the chamber 110. However, the shutter 156 is not limited in material to metal. For example, the shutter 156 may be made of a ceramic or plastic material with a property capable of effectively blocking the electromagnetic wave. Further, the shutter 156 may be arranged to be connected to the inner surface of the facility cover 150 instead of the outer surface of the facility cover 150.

The shutter 156 may be arranged at the viewport parts of the facility cover 150 at which the laser sensor 120*h* and the reflection plate 130 are located to shut the viewport parts of the facility cover 150 while the laser sensor 120*h* stops detecting the laser beam LB, thereby protecting the laser sensor 120*h* and the reflection plate 130 against the electromagnetic wave. For reference, the laser sensor 120*h* may remain in the ON state when detecting the laser beam LB or always independently of detection of the laser beam LB.

Figure 11:
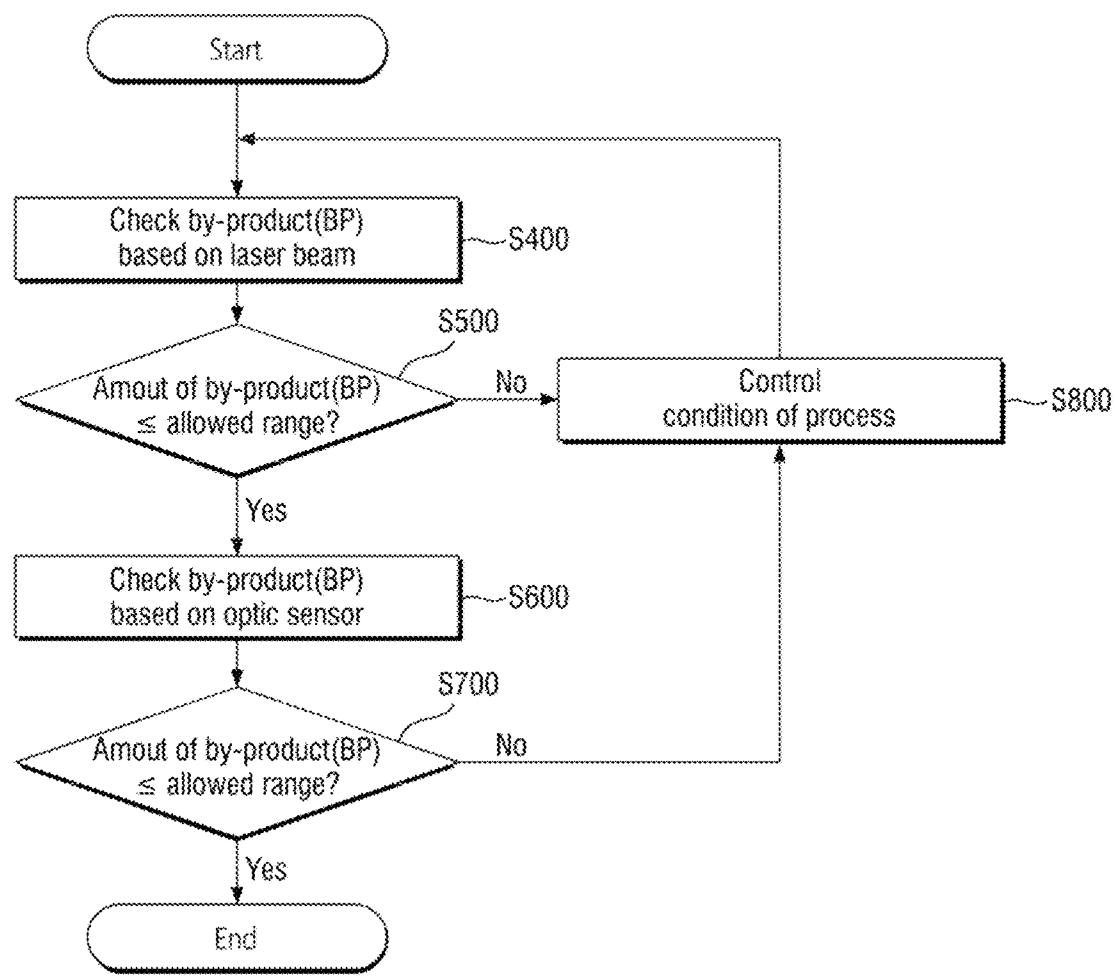
FIGS. 11 and 12 are flowcharts for explaining an operation of a semiconductor deposition monitoring device according to some embodiments.
Figure 12:
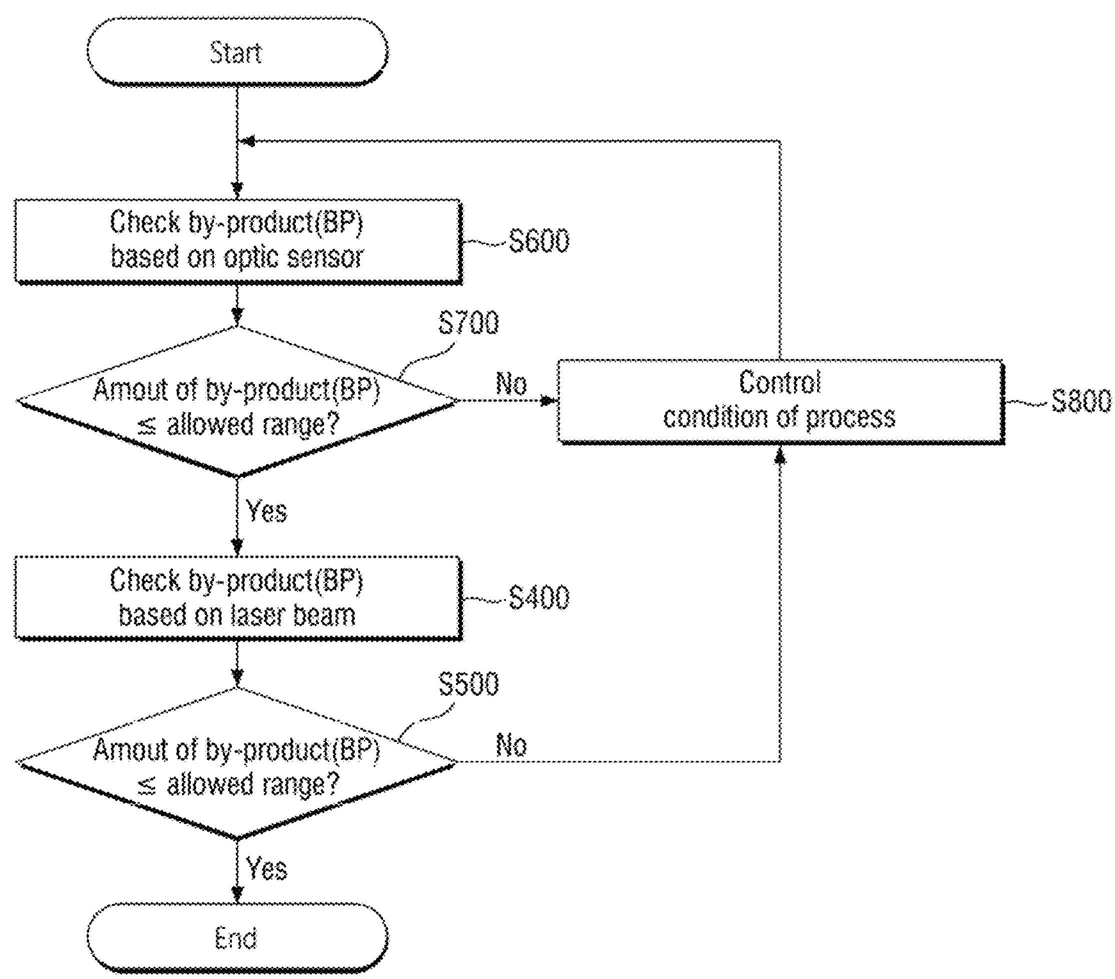

FIGS. 11 and 12 are flowcharts for explaining an operation of a semiconductor deposition monitoring device according to some embodiments.

Referring to FIGS. 9 and 11, in the operation of the semiconductor deposition monitoring device of FIG. 9 according to some embodiments, first, the state of the by-product coated on the cover dome is checked based on the intensity of the laser beam (step S250). Checking the state of the by-product BP may include, for example, calculating or quantifying the thickness of the by-product BP according to the intensity of the laser beam.

Next, the state of the by-product BP is determined to be, or not to be, within the tolerance range (step S500). For example, the thickness of the by-product BP may be calculated or quantified according to the intensity of the laser beam is within a predetermined tolerance range.

If the state of the by-product BP is out of the tolerance range (N at step S500), according to the state of the by-product BP, the process condition is adjusted, or the cover dome 110*c* is cleaned or replaced (step S800). Adjusting the process condition may include adjusting the temperature inside the chamber by correcting the temperature indicated by the pyrometer 160 or adjusting the lamp 140. The adjustment of the process condition and the cleaning and replacement of the cover dome 110*c* are performed as described in detail in association of the operation of the analysis and control computer 180 and/or the controller 500.

If the thickness of the by-product BP is within the tolerance range (Y at step S500), the state of the by-product BP coated on the cover dome is checked based on the intensity of the light (step S600). Checking the state of the by-product BP may include, for example, calculating or quantifying the thickness of the by-product BP according to the intensity of the light.

Then, the state of the by-product BP is determined to be, or not to be, within the tolerance range (step S700). For example, the thickness of the by-product BP may be calculated or quantified according to the intensity of the light is within a predetermined tolerance range.

If the state of the by-product BP is out of the tolerance range (N at step S700), according to the state of the by-product BP, the process condition is adjusted, or the cover dome 110*c* is cleaned or replaced (step S800). Adjusting the process condition may include adjusting the temperature inside the chamber by correcting the temperature indicated by the pyrometer 160 or adjusting the lamp 140. The adjustment of the process condition and the cleaning and replacement of the cover dome 110*c* are performed as described in detail in association of the operation of the controller 500.

If the thickness of the by-product BP is within the tolerance range (Y at step S700), the semiconductor deposition monitoring device determines that the deposition has been performed correctly and proceeds to perform the subsequent process.

As processes for making a determination on the by-product BP, steps S400 and S500 for determination on the by-product BP using a laser beam and steps S600 and S700 for determination on the by-product BP using light may be performed in the reverse order as shown in FIG. 12. The detailed description of FIG. 12 is identical with that of FIG. 11 except for a difference in the order of steps, and thus is omitted.

What is claimed is:

1. A semiconductor deposition monitoring device, comprising:

a controller;

a supporting table configured to support a deposition target wafer on which a deposition material is deposited;

a chamber surrounding a reaction space including the supporting table, the chamber including an upper dome covering upper portions of the supporting table and the deposition target wafer, a lower dome covering lower portions of the supporting table and the deposition target wafer, and a chamber body between the upper dome and the lower dome, wherein the upper dome and the lower dome are separably attached to the chamber body;

a facility cover surrounding the chamber and forming an upper space between the upper dome and the facility cover and a lower space between the lower dome and the facility cover, wherein the upper space is separated from the lower space by the chamber;

an upper lamp above the chamber in the upper space, wherein the upper lamp provides radiant heat to the reaction space via the upper dome;

a lower lamp below the chamber in the lower space, wherein the lower lamp provides radiant heat to the reaction space via the lower dome;

a laser configured to irradiate a laser beam from outside of the chamber;

a laser sensor configured to detect an intensity of the laser beam transmitted through the chamber;

a lamp configured to irradiate light to the chamber;

an optical sensor configured to receive the irradiated light and measure an amount of the deposition material formed in the chamber;

a conduit including an inlet conduit through which air is injected onto the chamber and an outlet conduit through which the air is discharged from the chamber, and including a plurality of sensors for sensing information of the air; and a heat exchanger module connected to the conduit and configured to adjust heat of the air based on sensing values received from the plurality of sensors, wherein the inlet conduit includes an upper inlet conduit through which the air is injected from the heat exchanger module via the upper space adjacent to the upper lamp onto the upper dome, and a lower inlet conduit through which the air is injected from the heat exchanger module via the lower space adjacent to the lower lamp onto the lower dome, wherein the upper inlet conduit and the lower inlet conduit are separately connected to the heat exchanger module, and the outlet conduit includes an upper outlet conduit through which the air is discharged from the upper dome to the heat exchanger module and a lower outlet conduit through which the air is discharged from the lower dome to the heat exchanger module, wherein the upper outlet conduit and the lower outlet conduit are separately connected to the heat exchanger module, wherein the upper dome and the lower dome include a transparent material through which the laser beam is transmitted, and wherein the controller is configured to measure a by-product on the upper dome according to the intensity of the laser beam transmitted through the upper dome and received by the laser sensor, and the controller is configured to measure the by-product on the lower dome according to the irradiated light transmitted through the lower dome and received by the optical sensor.

2. The semiconductor deposition monitoring device of claim 1, wherein the optical sensor includes an optical fiber to which the light is irradiated, and a photo diode which converts the light into an electrical signal.

3. The semiconductor deposition monitoring device of claim 1, wherein the plurality of sensors include at least one of a pressure sensor, a temperature sensor, or a speed sensor.

4. The semiconductor deposition monitoring device of claim 3, wherein the pressure sensor is connected to the outlet conduit.

5. The semiconductor deposition monitoring device of claim 3, wherein the temperature sensor is connected to the outlet conduit and the inlet conduit.

6. The semiconductor deposition monitoring device of claim 3, wherein the speed sensor is connected to the outlet conduit and the inlet conduit.

7. The semiconductor deposition monitoring device of claim 1, wherein the heat exchanger module includes a sensing amplifier which amplifies the sensing values and a calculator which calculates a heat quantity of the air using the sensing values.

* * * * *